United States Patent
Zhang et al.

(10) Patent No.: US 11,742,427 B2
(45) Date of Patent: Aug. 29, 2023

(54) SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Bo Su, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/677,791

(22) Filed: Feb. 22, 2022

(65) Prior Publication Data

US 2022/0181482 A1 Jun. 9, 2022

Related U.S. Application Data

(63) Continuation of application No. 16/795,864, filed on Feb. 20, 2020, now Pat. No. 11,309,420.

(30) Foreign Application Priority Data

Feb. 25, 2019 (CN) .......................... 201910138146.5

(51) Int. Cl.
*H01L 29/78* (2006.01)
*H01L 21/3065* (2006.01)
*H01L 21/3213* (2006.01)
*H01L 29/66* (2006.01)

(52) U.S. Cl.
CPC ........ *H01L 29/785* (2013.01); *H01L 21/3065* (2013.01); *H01L 21/32137* (2013.01); *H01L 29/66795* (2013.01)

(58) Field of Classification Search
CPC ............... H01L 21/3065; H01L 29/785; H01L 21/32137; H01L 29/66795
USPC ....................................................... 257/288
See application file for complete search history.

(56) References Cited

U.S. PATENT DOCUMENTS

| | | |
|---|---|---|
| 2008/0296667 A1 | 12/2008 | Mikasa |
| 2012/0228682 A1 | 9/2012 | Yoshida |
| 2015/0270373 A1* | 9/2015 | Horak ................. H01L 29/4966 438/589 |
| 2017/0047340 A1* | 2/2017 | Huo .................... H01L 29/7887 |
| 2017/0330955 A1* | 11/2017 | Rahhal-Orabi ... H01L 29/66795 |
| 2018/0308842 A1 | 10/2018 | Lee et al. |
| 2018/0337095 A1 | 11/2018 | Chen et al. |

(Continued)

*Primary Examiner* — Igwe U Anya

(74) *Attorney, Agent, or Firm* — Anova Law Group, PLLC

(57) ABSTRACT

The present disclosure provides a semiconductor device. The semiconductor device includes a substrate, having a plurality of fins on a surface of the substrate; a gate structure across the plurality of fins. The gate structure is located on a portion of a top surface and sidewall surfaces of the plurality of fins. The gate structure includes a first region and a second region on the first region. A bottom boundary of the second region is higher than the top surface of the plurality of fins. A size of the first region in an extending direction of the plurality of fins is smaller than a size of the second region in the extending direction of the plurality of fins.

7 Claims, 7 Drawing Sheets

(56) References Cited

U.S. PATENT DOCUMENTS

2019/0189614 A1  6/2019  Lee et al.
2019/0386115 A1  12/2019  Lin et al.

* cited by examiner

SEMICONDUCTOR DEVICE

CROSS-REFERENCES TO RELATED APPLICATION

This application is a continuation application of U.S. patent application Ser. No. 16/795,864, filed on Feb. 20, 2020, which claims the priority of Chinese Patent Application No. 201910138146.5, filed on Feb. 25, 2019, the content of which is incorporated herein by reference in its entirety.

TECHNICAL FIELD

The present disclosure generally relates to the field of semiconductor manufacturing and, in particular, to a semiconductor device and a fabrication method thereof.

BACKGROUND

With development of semiconductor technologies, control capability of a conventional planar Metal-Oxide-Semiconductor (MOS) transistor on a channel current is weak, resulting in a severe leakage current. A fin field effect transistor (Fin FET) is an emerging multi-gate device that generally includes fins protruding from a surface of a semiconductor substrate, a gate structure covering a portion of a top surface and sidewalls of the fins, and source-drain doped regions located in the fins on both sides of the gate structure.

The gate structure is formed by a multi-step etching process on a gate dielectric material layer and a gate electrode material layer on a surface of the gate dielectric material layer. However, since a space of junctions between the gate structure and the fins is relatively small, the etching process cannot completely remove the gate structure at the junctions due to the limited space, resulting in remaining of gate structure materials. There is a need to improve performance of the semiconductor device.

SUMMARY

One aspect of the present disclosure provides a fabrication method of a semiconductor device, including: providing a substrate having a plurality of fins on a surface of the substrate; forming an initial gate structure across the plurality of fins, that the initial gate structure covers a portion of a top surface and sidewall surfaces of the plurality of fins, the initial gate structure includes an initial first region and an initial second region on the initial first region, a bottom boundary of the initial second region is higher than the top surface of the plurality of fins, and a size of the initial first region in an extending direction of the plurality of fins is larger than a size of the initial second region in the extending direction of the plurality of fins; and performing a first etching process on sidewalls of the initial gate structure to form a gate structure, that the gate structure includes a first region formed by etching the initial first region, and a second region formed by etching the initial second region, and a size of the first region in the extending direction of the plurality of fins is smaller than a size of the second region in the extending direction of the plurality of fins.

Another aspect of the present disclosure provides a semiconductor device, including: a substrate having a plurality of fins on a surface of the substrate; a gate structure across the plurality of fins, that the gate structure is located on a portion of a top surface and sidewall surfaces of the plurality of fins, the gate structure includes a first region and a second region on the first region, a bottom boundary of the second region is higher than the top surface of the plurality of fins, and a size of the first region in an extending direction of the plurality of fins is smaller than a size of the second region in the extending direction of the plurality of fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

FIGS. 1 to 4 illustrate structures corresponding to certain stages during a conventional fabrication process of a semiconductor device.

Figure 1:
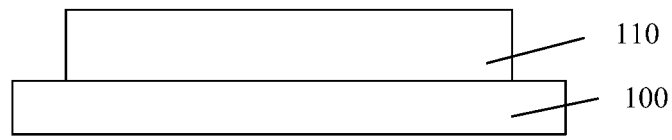
FIGS. 1 to 4 illustrate structures corresponding to certain stages during a conventional fabrication process of a semiconductor device.

Referring to FIG. 1, a substrate 100 is provided having a plurality of mutually discrete fins 110 on a surface of the substrate 100.

Figure 2:
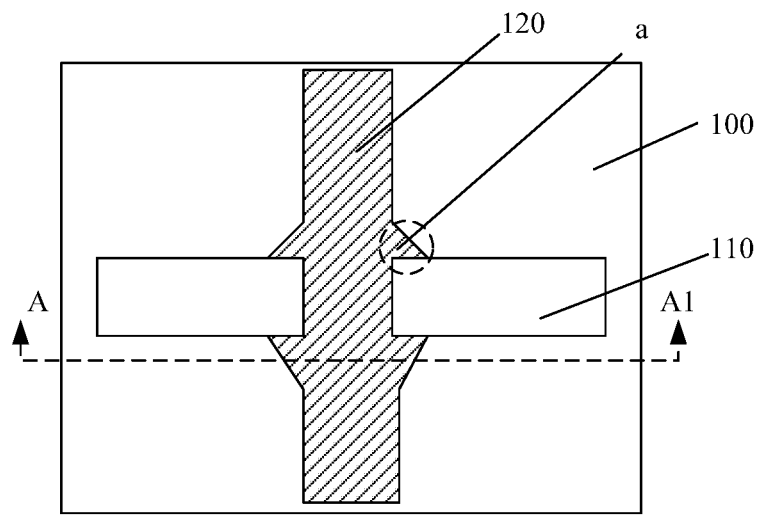
Figure 3:
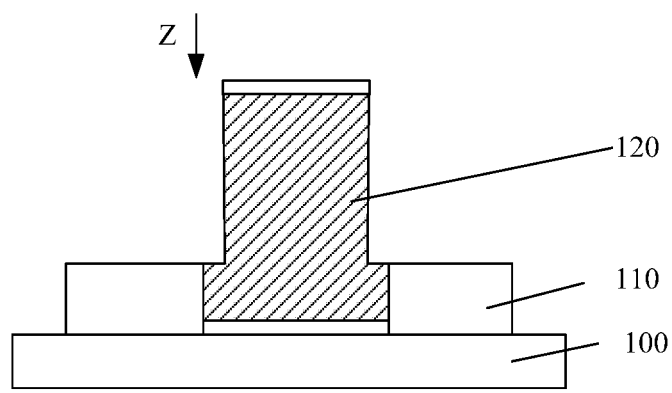

Referring to FIG. 2 and FIG. 3, FIG. 2 is a top view of FIG. 3 in a Z direction, and FIG. 3 is a cross-sectional view of FIG. 2 along an A-A1 direction. A gate structure 120 is formed to span across the plurality of mutually discrete fins 110. The gate structure 120 covers a portion of a top surface and sidewall surfaces of the plurality of mutually discrete fins 110.

Figure 4:
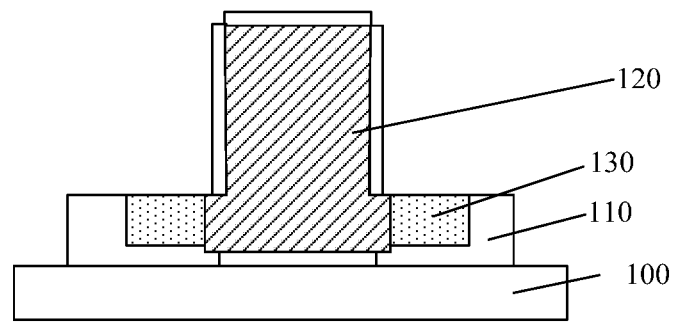

Referring to FIG. 4, view directions of FIG. 4 and FIG. 3 are the same, and source-drain doped regions 130 are formed in the plurality of mutually discrete fins 110 on both sides of the gate structure 120.

In the conventional fabrication method of a semiconductor device, a method of forming the gate structure 120 includes: forming a gate dielectric material layer on the substrate 100 and a gate electrode material layer on a surface of the gate dielectric material layer, that the gate dielectric layer covers the top surface and the sidewall surfaces of the plurality of mutually discrete fins; and patterning the gate dielectric material layer and the gate electrode material layer by a multi-step etching process to form a gate dielectric layer and a gate electrode layer, that the gate structure 120 includes the gate dielectric layer and the gate electrode layer.

Corner regions a at junctions between the gate structure 120 and the plurality of mutually discrete fins 110 have a relatively small space. Due to space constraints, the multi-step etching process cannot completely remove the gate structure 120 in the corner regions a, and the formed gate structure 120 has remaining in the corner regions a, so that a width of the gate structure 120 covering a portion of the sidewall surfaces of the plurality of mutually discrete fins 110 is larger than a width of the gate structure 120 located above the top surface of the plurality of mutually discrete fins 110. The remaining of the gate structure 120 at the corner regions a easily connects the gate structure 120 to the subsequently formed source-drain doped regions 130, thereby generating a leakage current, and affecting the performance of the formed semiconductor device.

The width of the gate structure 120 refers to a dimension along a direction in which the plurality of mutually discrete fins 110 extends.

To solve the technical problem, the present disclosure provides a fabrication method of a semiconductor device, including: performing a first etching process on sidewalk of an initial gate structure to form a gate structure, that the gate structure includes a first region formed by etching an initial first region and a second region formed by etching an initial second region, and a size of the first region in a direction in which fins extends is smaller than a size of the second region. The semiconductor device formed by the method according to the present disclosure has better performance.

The above described objects, features and advantages of the present disclosure may become easier to be understood from the embodiments of the present disclosure described in detail below with reference to the accompanying drawings.

FIGS. 5 to 16 illustrate structures corresponding to certain stages during an exemplary fabrication process of a semiconductor device consistent with various disclosed embodiments of the present disclosure.

Figure 17:
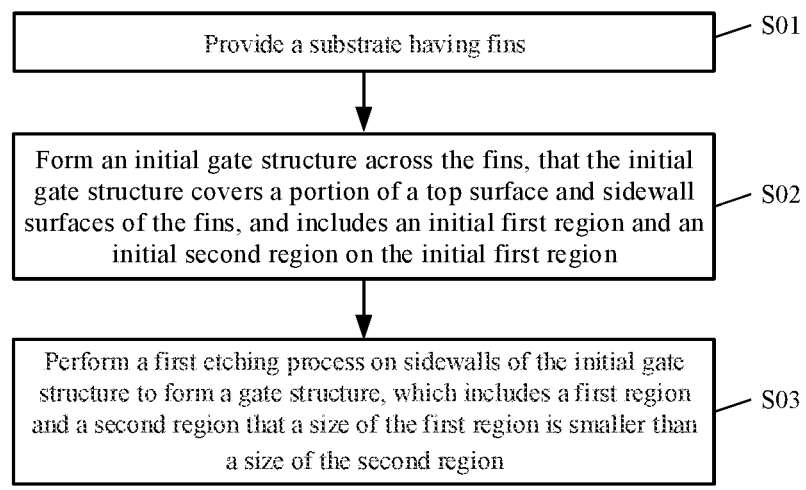
FIG. 17 illustrates an exemplary fabrication process of a semiconductor device consistent with various disclosed embodiments of the present disclosure.

FIG. 17 illustrates an exemplary fabrication process of a semiconductor device consistent with various disclosed embodiments of the present disclosure.

Figure 5:
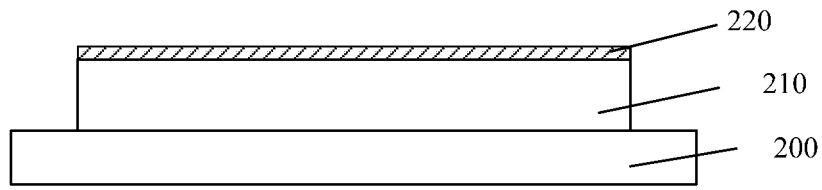
FIGS. 5 to 16 illustrate structures corresponding to certain stages during an exemplary fabrication process of a semiconductor device consistent with various disclosed embodiments of the present disclosure.

Referring to FIG. 5, a substrate 200 is provided having a plurality of mutually discrete fins 210 on a surface of the substrate 200, according to S01 in FIG. 17.

In one embodiment, the substrate 200 is made of monocrystalline silicon. The substrate may also be made of one of polysilicon and amorphous silicon. The substrate may also be made of a semiconductor material such as one of germanium, silicon germanium, gallium arsenide, and the like. The substrate may also be a semiconductor-on-insulator structure including an insulator and a semiconductor material layer on the insulator, and the semiconductor material layer is made of a semiconductor material such as one of silicon, germanium, silicon germanium, gallium arsenide, and indium gallium arsenide.

In one embodiment, the substrate 200 and the plurality of mutually discrete fins 210 on the surface of the substrate 200 are formed by etching an initial substrate. In other embodiments, a fin material layer is formed on a substrate and then the fin material layer is patterned to form fins 210.

In one embodiment, a top surface of the plurality of mutually discrete fins 210 has a mask protection layer 220.

The mask protection layer 220 may be made of one of silicon oxide, silicon nitride, and silicon oxynitride. In one embodiment, the mask protection layer 220 is made of silicon oxide.

The mask protection layer 220 is used to prevent the plurality of mutually discrete fins 210 from being damaged in subsequent etching processes.

Figure 6:
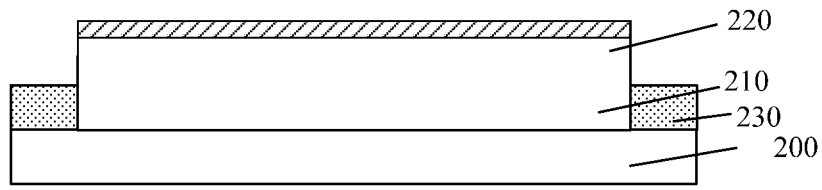

Referring to FIG. 6, an isolation structure 230 is formed on the surface of the substrate 200, the isolation structure 230 covers a portion of sidewalls of the plurality of mutually discrete fins 210, and a top surface of the isolation structure 230 is lower than the top surface of the plurality of mutually discrete fins 210.

A process of forming the isolation structure 230 includes one of a chemical vapor deposition process, a physical vapor deposition process, and a thermal oxidation process.

The isolation structure 230 may be made of one of silicon oxide, oxynitride, and silicon nitride. In one embodiment, the isolation structure 230 is made of silicon oxide, and the silicon oxide can adhere well to the silicon substrate.

The isolation structure 230 is used to achieve electrical isolation between different semiconductor devices.

After the isolation structure 230 is formed, an initial gate structure is formed across the plurality of mutually discrete fins 210 according to S02 in FIG. 17, the initial gate structure covers a portion of the top surface and the sidewall surfaces of the plurality of mutually discrete fins, the initial gate structure includes an initial first region and an initial second region on the initial first region, a bottom boundary of the initial second region is higher than the top surface of the plurality of mutually discrete fins, and the initial first region has a larger dimension than the initial second region in an extending direction of the plurality of mutually discrete fins.

Figure 7:
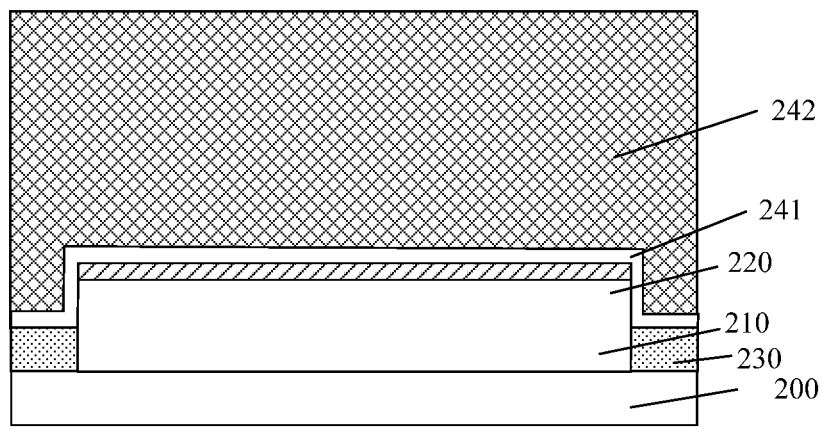
Figure 8:
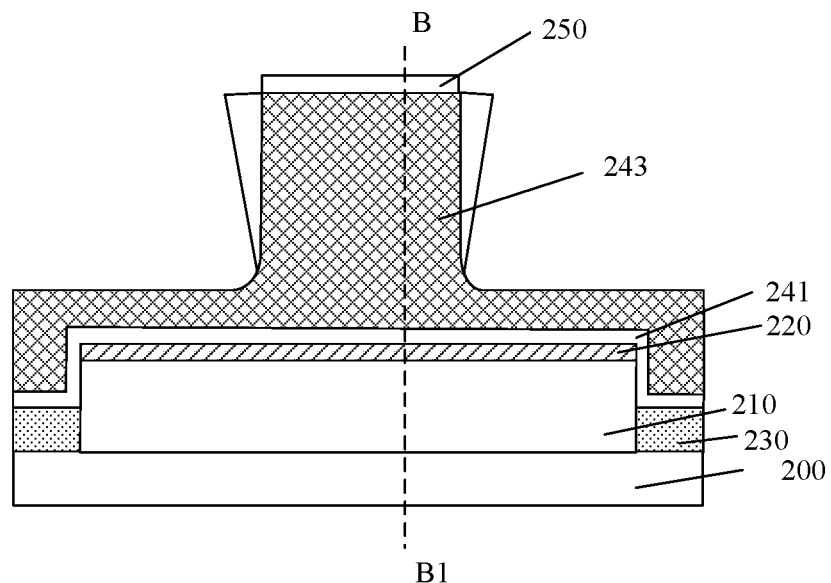
Figure 9:
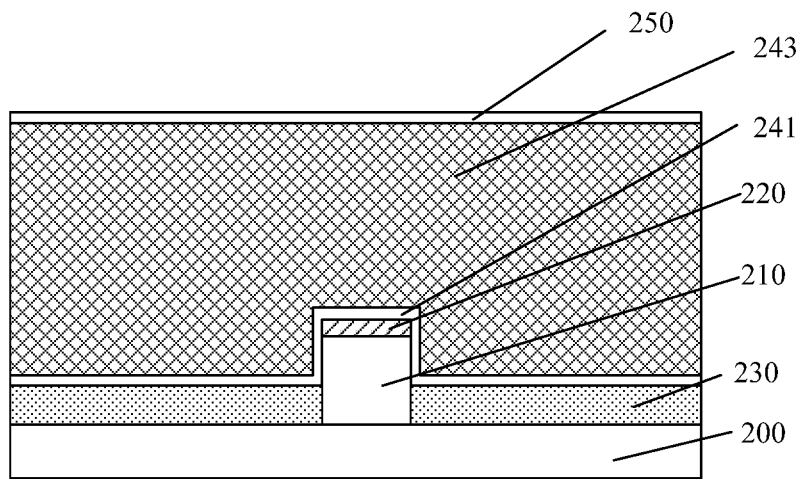

In one embodiment, a gate dielectric material layer and a gate electrode material layer on a surface of the gate dielectric material layer are formed on the substrate. The gate dielectric material layer and the gate electrode material layer are patterned to form an initial gate dielectric layer and an initial gate electrode layer. The initial gate structure includes the initial gate dielectric layer and the initial gate electrode layer on a surface of the initial gate dielectric layer. Referring to FIGS. 7 to 9, details of a formation process of the initial gate structure are described.

Referring to FIG. 7, a gate dielectric material layer 241 and a gate electrode material layer 242 on a surface of the gate dielectric material layer 241 are formed on the substrate 200.

In one embodiment, the gate dielectric material layer 241 is located on the top surface of the isolation structure 230 and covers the top surface and the sidewall surfaces of the plurality of mutually discrete fins 210.

The gate dielectric material layer 241 may be made of one of silicon oxide and a high-k dielectric material such as one of $HfO_2$, $La_2O_3$, HfSiON, $HfAlO_2$, $ZrO_2$, $Al_2O_3$, and $HfSiO_4$. In one embodiment, the gate dielectric material layer 241 is made of silicon oxide.

The gate electrode material layer 242 may be made of one of polysilicon and polysilicon. In one embodiment, the gate electrode material layer 242 is made of polysilicon.

A forming process of the gate dielectric material layer 241 includes one of a chemical vapor deposition process and a physical vapor deposition process.

A forming process of the gate electrode material layer 242 includes one of a chemical vapor deposition process and a physical vapor deposition process.

The gate dielectric material layer 241 and the gate electrode material layer 242 are used to subsequently form an initial gate structure.

Referring to FIG. 8 and FIG. 9, FIG. 9 is a schematic cross-sectional view of FIG. 8 taken along a line B-B1, and FIG. 8 is a schematic view based on FIG. 7. A first mask layer 250 is formed on a surface of the gate electrode material layer 242. The first mask layer 250 exposes a portion of the surface of the gate electrode material layer 242. The first mask layer 250 extends along a width direction of the plurality of mutually discrete fins 210. A second etching process is performed, and the gate electrode material layer 242 is etched by using the first mask layer 250 as a mask to form an initial gate electrode material layer 243 having a top surface of the initial gate electrode material layer 243 higher than the top surface of the plurality of mutually discrete fins 210. The second etching process includes one or a combination of a dry etching process and a wet etching process.

A portion of the initial gate electrode material layer 243 that is located on two sides of the first mask layer 250 has a top surface higher than the top surface of the plurality of mutually discrete fins 210.

In one embodiment, the second etching process is a dry etching process. Parameters of the dry etching process include: reaction gases used including $SF_6$, $Cl_2$, $O_2$, $CH_2F_2$, and HBr, that a flow rate of $SF_6$ is about 0 standard milliliters/minute to about 100 standard milliliters/minute, a flow rate of $Cl_2$ is about 0 standard milliliters/minute to about 100 standard milliliters/minute, a flow rate of $O_2$ is about 50 standard milliliters/minute to about 100 standard milliliters/minute, a flow rate of $CH_2F_2$ is about 0 standard milliliters/minute to about 50 standard milliliters/minute, a flow rate of HBr is about 10 standard milliliters/minute to about 200 standard milliliters/minute, a pressure is about 1 mTorr to about 50 mTorr, a source Radio Frequency (RF) power is about 100 watts to about 1000 watts, and a bias RF voltage is about 50 volts to about 1200 volts.

The top surface of the initial gate electrode material layer 243 is higher than the top surface of the plurality of mutually discrete fins 210 in a range of about 100 Å to about 200 Å.

Figure 10:
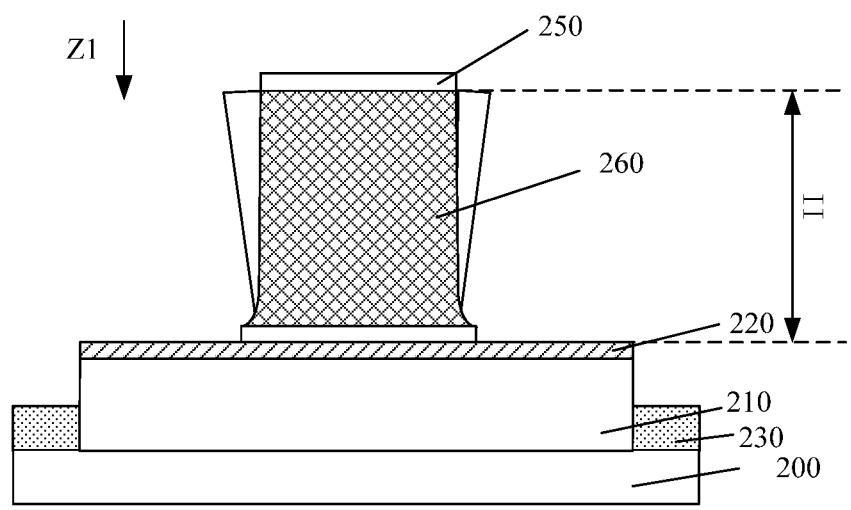
Figure 11:
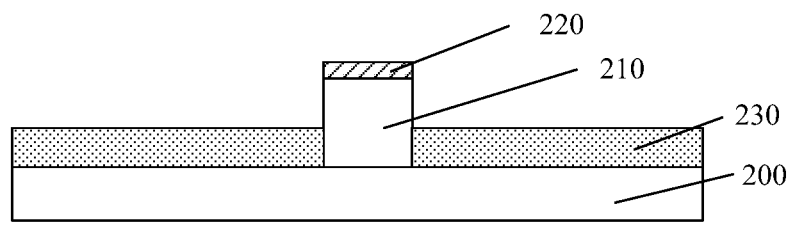
Figure 12:
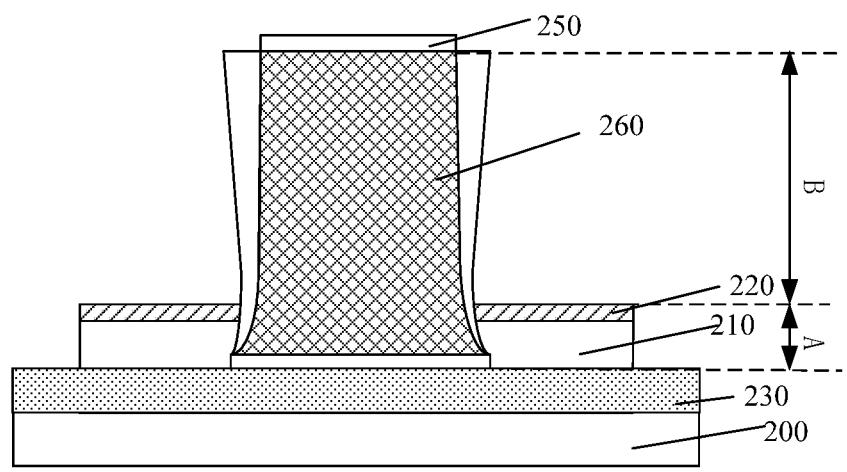
Figure 13:
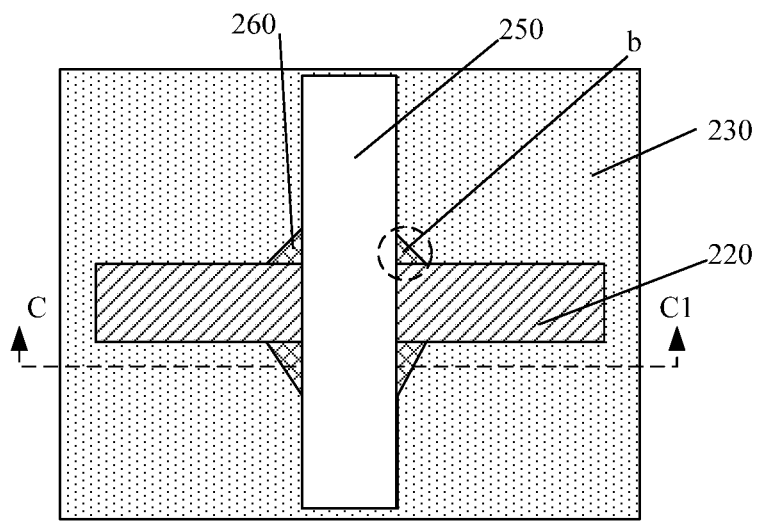

Referring to FIG. 10 to FIG. 13, FIG. 10 is a schematic view based on FIG. 8, FIG. 11 is a schematic cross-sectional view of FIG. 8, FIG. 12 is a cutaway view of FIG. 13 along a C-C1 direction, and FIG. 13 is a top view of FIG. 10 along a Z1 direction. After the initial gate electrode material layer 243 is formed, a third etching process is performed, that the initial gate electrode material layer 243 and the gate dielectric material layer 241 are further etched by using the first mask layer 250 as a mask, until the top surface of the isolation structure 230 and the top surface of the mask protection layer 220 are exposed, to form an initial gate dielectric layer (not shown) and an initial gate electrode layer on a surface of the initial gate dielectric layer (not shown), and an initial gate structure 260 includes the initial gate dielectric layer and the initial gate electrode layer.

The third etching process includes one or a combination of a dry etching process and a wet etching process.

An etching rate of the mask protection layer 220 by the third etching process is less than an etching rate of the initial gate electrode layer.

In one embodiment, the third etching process is a dry etching process. Parameters of the dry etching process include: reaction gases used including $CH_4$, $O_2$, $Cl_2$, Ar, and $CF_4$, that a flow rate of $CH_4$ is about 5 standard milliliters/minute to about 100 standard milliliters/minute, a flow rate of $O_2$ is about 5 standard milliliters/minute to about 200 standard milliliters/minute, a flow rate of $Cl_2$ is about 10 standard milliliters/minute to about 200 standard milliliters/minute, a flow rate of Ar is about 50 standard milliliters/minute to about 500 standard milliliters/minute, a flow rate of $CF_4$ is about 0 standard milliliters/minute to about 100 standard milliliters/minute, a pressure is about 10 mTorr to about 100 mTorr, a source RF power is about 100 watts to about 1000 watts, and a bias RF voltage is about 100 volts to about 1500 volts.

Since the etching rate of the mask protection layer 220 is less than the etching rate of the initial gate electrode material layer 243 by the third etching process, when a portion of the initial gate electrode material layer 243 is removed by using the first mask layer 250 as a mask, to expose the top surface of the isolation structure 230 and the top surface of the mask protection layer 220, the mask protection layer 220 located on the top surface of the plurality of mutually discrete fins 210 is less damaged, so that the mask protection layer 220 can provide better protection to the top surface of the plurality of mutually discrete fins 210, and the formed semiconductor device has better performance.

In one embodiment, the initial gate structure 260 includes an initial first region A and an initial second region B located on the initial first region A, and a bottom boundary of the initial second region B is higher than the top surface of the plurality of mutually discrete fins 210. Since a space of corner regions b at junctions between the initial gate electrode material layer 243 and the plurality of mutually discrete fins 210 is relatively small, the third etching process cannot completely remove the initial gate electrode material layer in the corner regions b, due to space constraints, so the initial gate electrode material layer is likely to remain in the corner regions b, so that a size of the initial first region A of the initial gate structure 260 in an extending direction of the plurality of mutually discrete fins 210 is larger than a size of the initial second region B of the initial gate structure 260.

Figure 14:
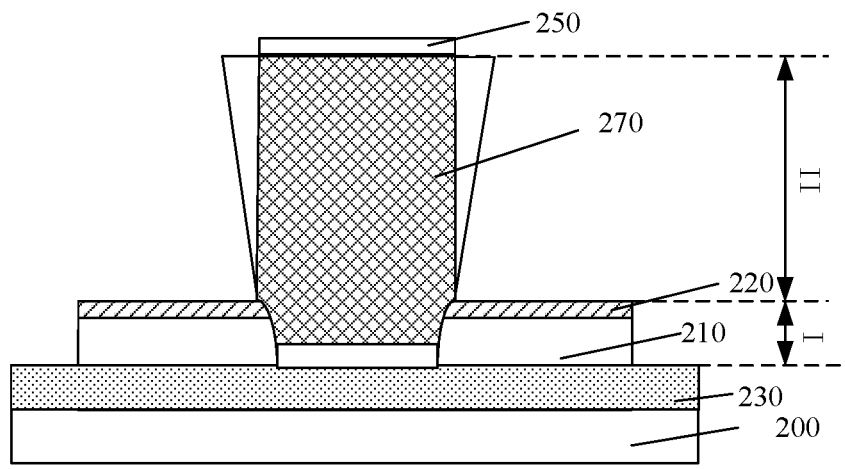
Figure 15:
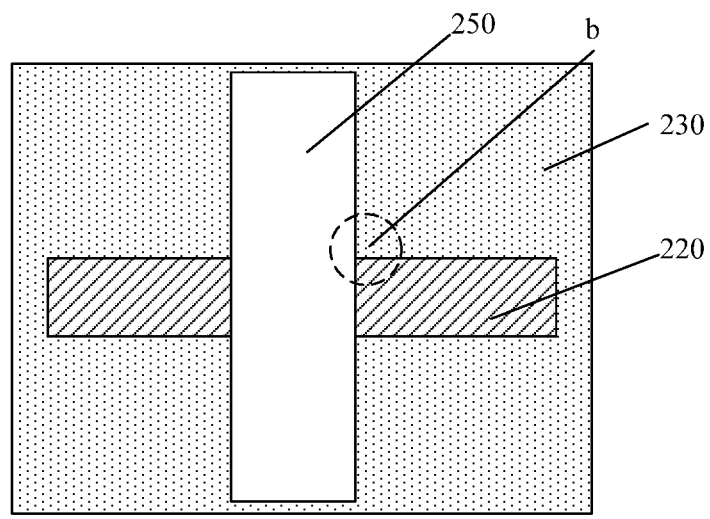

Referring to FIG. 14 and FIG. 15, FIG. 14 is a schematic view based on FIG. 12, and FIG. 15 is a schematic view based on FIG. 13. After the initial gate structure 260 is formed, a first etching process is performed on the initial gate structure 260 to form a gate structure 270, according to 503 in FIG. 17. The gate structure 270 includes a first region I formed by etching of the initial first region, and a second region II formed by etching of the initial second region. A size of the first region I in the extending direction of the plurality of mutually discrete fins 210 is smaller than a size of the second region II. In one embodiment, the first region I of the gate structure 270 has an inverted trapezoid in a cross section parallel to the extending direction of the plurality of mutually discrete fins 210 and perpendicular to the surface of the substrate 200.

By performing the first etching process on the initial gate structure 260, the initial first region A of the initial gate structure 260 can be further reduced in the extending direction of the plurality of mutually discrete fins 210, and the size of the initial second region B of the initial gate structure 260 in the extending direction of the plurality of mutually discrete fins 210 is not easily changed, so that the size of the first region I of the formed gate structure 270 in the extending direction of the plurality of mutually discrete fins 210 is smaller than the size of the second region II. Meanwhile, a bottom boundary of the second region II is higher than the top surface of the plurality of mutually discrete fins 210, and the first region I is located at the bottom of the second region II, that is, the first region I of the gate structure 270 covers the sidewall surfaces of the plurality of mutually discrete fins 210. When source-drain doped regions are formed in the plurality of mutually discrete fins 210 on both sides of the gate structure 270, the first region I of the gate structure 270 is not easily connected to the source-drain doped regions, thereby avoiding a leakage current, so that the performance of the formed semiconductor devices is improved.

The first etching process is an asynchronous pulse etching process, and a method of the asynchronous pulse etching process includes: providing a plasma source; providing a bias power source; performing a first-stage etching, that the plasma source provides a first source power and the bias power source provides a first bias power in the first-stage etching; and performing a second-stage etching, that the plasma source provides a second source power and the bias power source provides a second bias power in the second-stage etching, the first source power is less than the second source power, and the first bias power is greater than the second bias power.

In one embodiment, in the first-stage etching, the first-stage etching is an etching step, and the first-stage etching has a strong etching removal capability on the initial gate structure 260. That is, it is advantageous to remove the initial gate electrode layer in the corner regions at the junctions between the initial gate structure 260 and the plurality of mutually discrete fins 210. In the second-stage etching, the second-stage etching is a polymer deposition step. A polymer is deposited on sidewall surfaces of the initial gate structure 260. Since the initial first region A of the initial gate structure 260 is limited by space, the polymer is more easily deposited on sidewalls in the initial second region B of the initial gate structure 260. In summary, after the first-stage etching and the second-stage etching are alternately performed, the size of the first region I of the gate structure 270 in the extending direction of the plurality of mutually discrete fins 210 is smaller than the size of the second region II. Therefore, the gate structure 270 is prevented from being connected to subsequently formed source-drain doped regions, thereby avoiding a leakage current, and the performance of the formed semiconductor device is better.

In one embodiment, parameters of the asynchronous pulse etching process include: reaction gases used including $CH_4$, $O_2$, $Cl_2$, Ar, $CF_4$, and HBr, wherein a flow rate of $CH_4$ is about 5 standard milliliters/minute to about 100 standard milliliters/minute, a flow rate of $O_2$ is about 5 standard milliliters/minute to about 200 standard milliliters/minute, a flow rate of $Cl_2$ is about 10 standard milliliters/minute to about 200 standard milliliters/minute, a flow rate of Ar is about 50 standard milliliters/minute to about 500 standard milliliters/minute, a flow rate of $CF_4$ is about 0 standard milliliters/minute to about 100 standard milliliters/minute, a flow rate of HBr is about 50 standard milliliters/minute to about 200 standard milliliters/minute, a pressure is about 10 mTorr to about 100 mTorr, a source RF power is about 50 watts to about 1000 watts, and a bias RF voltage is about 100 volts to about 1000 volts.

A time length of the first-stage etching is a first time length, and a time length of the second-stage etching is a second time length. By controlling a ratio of the first time length to the second time length, a shape of the inverted trapezoid of the first region I of the formed gate structure 270 can be kept uniform.

In one embodiment, the ratio of the first time length to the second time length is about 1% to about 15%. Since the first-stage etching is used to etch the sidewalls of the initial gate structure 260, the second-stage etching is used to deposit the polymer on the sidewalls of the initial gate structure 260, when the ratio of the first time length to the second time length is about 1% to about 15%, it is advantageous for the first region I of the formed gate structure 270 to have a smaller slope of the inverted trapezoid in a cross section parallel to the extending direction of the plurality of mutually discrete fins 210 and perpendicular to the surface of the substrate 200. The slope refers to an angle between sidewalls of the first region I of the gate structure 270 and an exposed surface of the isolation structure 230.

Figure 16:
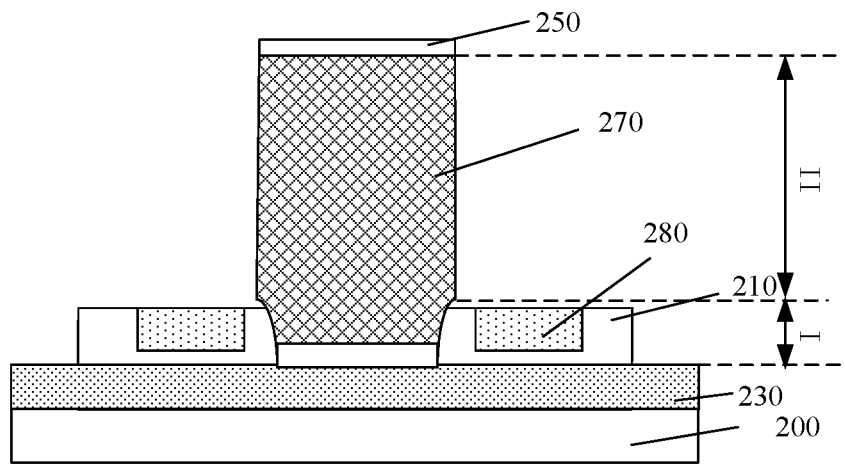

Referring to FIG. 16, FIG. 16 is a schematic view based on FIG. 14. After the gate structure 270 is formed, source-drain doped regions 280 are formed in the plurality of mutually discrete fins 210 on both sides of the gate structure 270. A method of forming the source-drain doped regions 280 includes: forming source-drain openings (not shown) in the plurality of mutually discrete fins 210 on both sides of the gate structure 270; forming an epitaxial layer (not shown) in the source-drain openings, and doping source-drain ions in the epitaxial layer to form the source-drain doped regions 280.

A material of the epitaxial layer and a conductivity type of the source-drain ions are related to a type of a transistor. In one embodiment, the semiconductor device is used to form an N-type MOS (NMOS) transistor, the material of the epitaxial layer includes one of silicon carbide and silicon, and the source-drain ions are N-type ions, such as one of phosphorus ions and arsenic ions.

In other embodiments, the semiconductor device is used to form a P-type MOS (PMOS) transistor, the material of the epitaxial layer includes one of silicon germanium and silicon, and the source-drain ions are P-type ions, such as boron ions.

Since the size of the first region I of the gate structure 270 along the extending direction of the plurality of mutually discrete fins 210 is smaller than the size of the second region II, the gate structure 270 is not easily connected to the source-drain doped regions 280, thereby avoiding a leakage current being generated, and improving the performance of the formed semiconductor device.

Accordingly, the present disclosure also provides a semiconductor device formed by the above method. Referring to FIGS. 13-14, the semiconductor device includes: a substrate 200 having a plurality of mutually discrete fins 210 on a surface of the substrate 200; a gate structure 270 spanning across the plurality of mutually discrete fins 210, that the gate structure 270 is located on a portion of a top surface and sidewall surfaces of the plurality of mutually discrete fins 210, the gate structure 270 includes a first region I and a second region II located on the first region I, a bottom boundary of the second region II is higher than the top surface of the plurality of mutually discrete fins 210, and a size of the first region I is smaller than a size of the second region II in an extending direction of the plurality of mutually discrete fins 210.

The size of the first region I of the gate structure 270 in the extending direction of the plurality of mutually discrete fins 210 is smaller than the size of the second region II, so that the gate structure 270 is not easily connected to source-drain doped regions formed in the plurality of mutually discrete fins 210, thereby preventing a leakage current from being generated, and improving the performance of the formed semiconductor device.

The details will be described below with reference to the accompanying drawings.

In one embodiment, the first region I of the gate structure 270 has an inverted trapezoid in a cross section parallel to the extending direction of the plurality of mutually discrete fins 210 and perpendicular to the surface of the substrate 200.

The gate structure 270 includes: a gate dielectric layer and a gate electrode layer on a surface of the gate dielectric layer; and the gate electrode layer is made of one of polysilicon and polysilicon.

In one embodiment, the semiconductor device further includes: an isolation structure 230 on the surface of the substrate 200, that the isolation structure 230 covers a portion of sidewalls of the plurality of mutually discrete fins 210, a top surface of the isolation structure 230 is lower than the top surface of the plurality of mutually discrete fins 210, and the gate structure 270 is located on a portion of a surface of the isolation structure 230.

In one embodiment, the semiconductor device further includes: a mask protection layer 220 on the top surface of the plurality of mutually discrete fins 210. The mask protection layer 220 may be made of one of silicon oxide, silicon nitride, and silicon oxynitride.

In one embodiment, referring to FIG. 16, the semiconductor device further includes: source-drain doped regions 280 located in the plurality of mutually discrete fins 210 on both sides of the gate structure 270.

Compared to the conventional method, the technical solution of the embodiments of the present disclosure has the following beneficial effects.

The fabrication method of a semiconductor device provided by the present disclosure can further reduce the size of the initial first region of the initial gate structure along the extending direction of the plurality of mutually discrete fins by performing the first etching process on the sidewalk of the initial gate structure. The size of the initial second region of the initial gate structure along the extending direction of the plurality of mutually discrete fins is not easily changed, so that the size of the first region of the gate structure formed in the extending direction of the plurality of mutually discrete fins is smaller than that of the second region. Meanwhile, the bottom boundary of the second region is higher than the top surface of the plurality of mutually discrete fins, and the first region is located at the bottom of the second region, that is, the first region of the gate structure covers the sidewall surfaces of the plurality of mutually discrete fins. When the source-drain doped regions are formed in the plurality of mutually discrete fins on both sides of the gate structure, the first region of the gate structure is less likely to be connected to the source-drain doped regions, thereby preventing a leakage current and improving the performance of the formed semiconductor device.

Further, the first etching process is an asynchronous pulse etching process, and the method of the asynchronous pulse etching process includes: providing a plasma source; and providing a bias power source. In the first-stage etching, the first-stage etching is an etching step, and the first-stage etching has a strong etching removal capability on the initial gate structure, that is, it is advantageous to remove the initial gate electrode layer in the corner regions at the junctions between the initial gate structure and the plurality of mutually discrete fins. In the second-stage etching, the second-stage etching is a polymer deposition step. The polymer is deposited on the sidewall surfaces of the initial gate structure. Since the initial first region of the initial gate structure is limited by space, the polymer is more easily deposited on the sidewalk in the initial second region of the initial gate structure. In summary, after the first-stage etching and the second-stage etching are alternately performed, the size of the first region of the gate structure in the extending direction of the plurality of mutually discrete fins is smaller than the size of the second region. Therefore, the gate structure is prevented from being connected to the subsequently formed source-drain doped regions, thereby avoiding a leakage current, and the performance of the formed semiconductor device is better.

Further, the etching rate of the mask protection layer by the third etching process is smaller than the etching rate of the initial gate electrode material layer. Since the etching rate of the mask protection layer on the top surface of the plurality of mutually discrete fins is much smaller than the etching rate of the initial gate electrode material layer by the third etching process, when a portion of the initial gate electrode material layer is removed by using the first mask layer as a mask, to expose the top surface of the isolation structure and the top surface of the mask protection layer, the mask protection layer located on the top surface of the plurality of mutually discrete fins is less damaged, so that the mask protection layer can provide better protection to the top surface of the plurality of mutually discrete fins, and the formed semiconductor device has better performance.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A semiconductor device, comprising:
   a substrate, having a plurality of fins on a surface of the substrate;
   a gate structure across the plurality of fins; and
   a mask protection layer on the top surface of the plurality of fins, the mask protection layer being made of one of silicon oxide, silicon nitride, and silicon oxynitride;
   wherein:
   the gate structure is located on a portion of a top surface and sidewall surfaces of the plurality of fins;
   the gate structure includes a first region and a second region on the first region;
   a bottom boundary of the second region is higher than the top surface of the plurality of fins;
   a size of the first region in an extending direction of the plurality of fins is smaller than a size of the second region in the extending direction of the plurality of fins; and
   an interface plane between the first region and the second region is coplanar with a top surface of the mask protection layer.

2. The device according to claim 1, wherein:
   the first region of the gate structure has an inverted trapezoid in a cross section parallel to the extending direction of the plurality of fins and perpendicular to a surface of the substrate.

3. The device according to claim 1, wherein:
   the gate structure includes: a gate dielectric layer, and a gate electrode layer on the gate dielectric layer; and
   the gate electrode layer is made of one of polysilicon and polycrystalline germanium.

4. The device according to claim 1, further comprising:
   an isolation structure on the surface of the substrate, wherein the isolation structure covers a portion of sidewalls of the plurality of fins, a top surface of the isolation structure is lower than the top surface of the plurality of fins, and the gate structure is located on a portion of a surface of the isolation structure.

5. The device according to claim 1, further comprising:
   source-drain doped regions in the plurality of fins on both sides of the gate structure.

6. The device according to claim 1, wherein:
   the first region of the gate structure has a reverse trapezoid profile.

7. The device according to claim 1, further including:
   a mask layer formed on the gate structure.

* * * * *